United States Patent
Innocent (10) Patent No.: US 11,239,856 B1
(45) Date of Patent: Feb. 1, 2022

(54) METAL-OXIDE-SEMICONDUCTOR CAPACITOR BASED CHARGE SHARING SUCCESSIVE APPROXIMATION REGISTER DATA CONVERTER

(71) Applicant: SEMICONDUCTOR COMPONENTS INDUSTRIES, LLC, Phoenix, AZ (US)

(72) Inventor: Manuel H. Innocent, Wezemaal (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 17/247,794

(22) Filed: Dec. 23, 2020

(51) Int. Cl.
*H03M 1/46* (2006.01)
*H04N 5/378* (2011.01)
*H03M 1/80* (2006.01)

(52) U.S. Cl.
CPC ........... *H03M 1/462* (2013.01); *H03M 1/804* (2013.01); *H04N 5/378* (2013.01)

(58) Field of Classification Search
CPC ....... H03M 1/462; H03M 1/804; H04N 5/378
USPC .......................................................... 341/172
See application file for complete search history.

(56) References Cited

U.S. PATENT DOCUMENTS

| | | | |
|---|---|---|---|
| 8,890,733 B2* | 11/2014 | Yamamoto | H03M 1/0854 341/123 |
| 9,071,265 B1 | 6/2015 | Dey | |
| 9,859,905 B2* | 1/2018 | Shionoiri | H03M 1/002 |
| 10,291,254 B2 | 5/2019 | Innocent | |
| 2006/0181622 A1 | 8/2006 | Hong | |
| 2014/0203958 A1 | 7/2014 | Okuda | |
| 2016/0105194 A1 | 4/2016 | Kumbaranthodiyil | |

OTHER PUBLICATIONS

Rabuske et al. "A 9-b 0.4-V Charge-Mode SAR ADC with 1.6-V Input Swing and a MOSCAP-only DAC," European Solid-State Circuits Conference (Sep. 2015).

* cited by examiner

Primary Examiner — Khai M Nguyen
(74) Attorney, Agent, or Firm — Treyz Law Group, P.C.; Jason Tsai (57) ABSTRACT

An image sensor may include an analog-to-digital converter. The converter may have a input capacitor, one or more metal-oxide-semiconductor capacitors, a digital-to-analog converter, and a comparator. An input signal may be sampled onto the input capacitor while the metal-oxide-semiconductor capacitors are activated. A few conversion steps may be performed while the metal-oxide-semiconductor capacitors are activated. After the few conversion steps, the metal-oxide-semiconductor capacitors are deactivated to realize a voltage gain, which makes the converter less sensitive to comparator noise.

20 Claims, 5 Drawing Sheets

METAL-OXIDE-SEMICONDUCTOR CAPACITOR BASED CHARGE SHARING SUCCESSIVE APPROXIMATION REGISTER DATA CONVERTER

BACKGROUND

This relates generally to image sensors and more specifically, to image sensors with analog-to-digital converters.

Modern electronic devices such as cellular telephones, cameras, and computers often use digital image sensors. Image sensors (sometimes referred to as imagers) may be formed from a two-dimensional array of image sensing pixels. The array of image sensing pixels are typically arranged in pixel rows and columns. Each pixel includes a photosensitive layer that receives incident photons (light) and converts the photons into electrical charge. Column sensing circuitry is typically coupled to each pixel column for reading out image signals from the image pixels.

Image sensors often include analog-to-digital conversion circuitry for converting analog signals generated from the image pixels to digital signals. In one configuration, an image sensor is provided with charge sharing successive approximation register (SAR) analog-to-digital converters (ADCs). A charge sharing SAR ADC has a feedback digital-to-analog converter (DAC) that is configured to successively add pre-charged capacitors in parallel based on the output of a comparator. The connection of additional capacitors in parallel attenuates the sampled input signal. While the signal charge remains the same, the signal voltage level will be attenuated by a factor of two at the end of conversion. This attenuation increases the sensitivity of the ADC to the noise associated with the comparator.

It is within this context that the embodiments herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
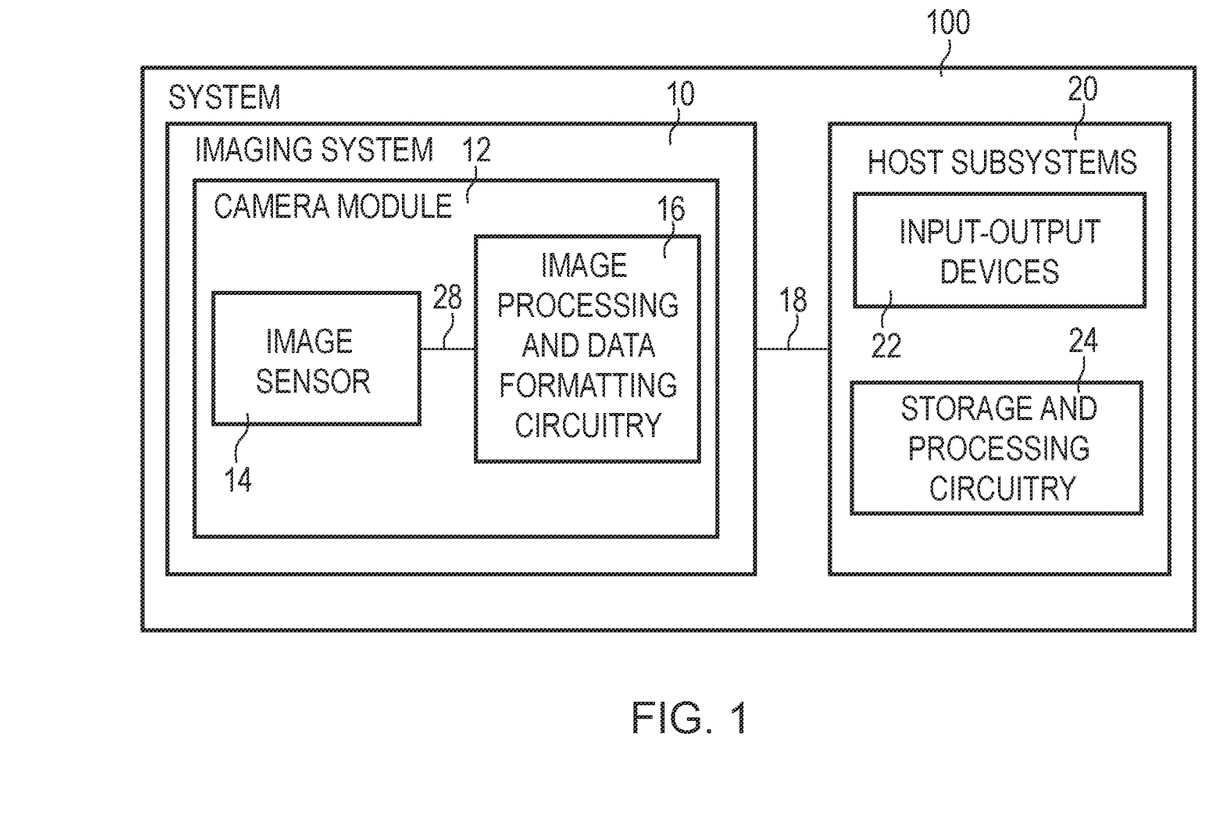
FIG. 1 is a diagram of an illustrative electronic device having an image sensor in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data. Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
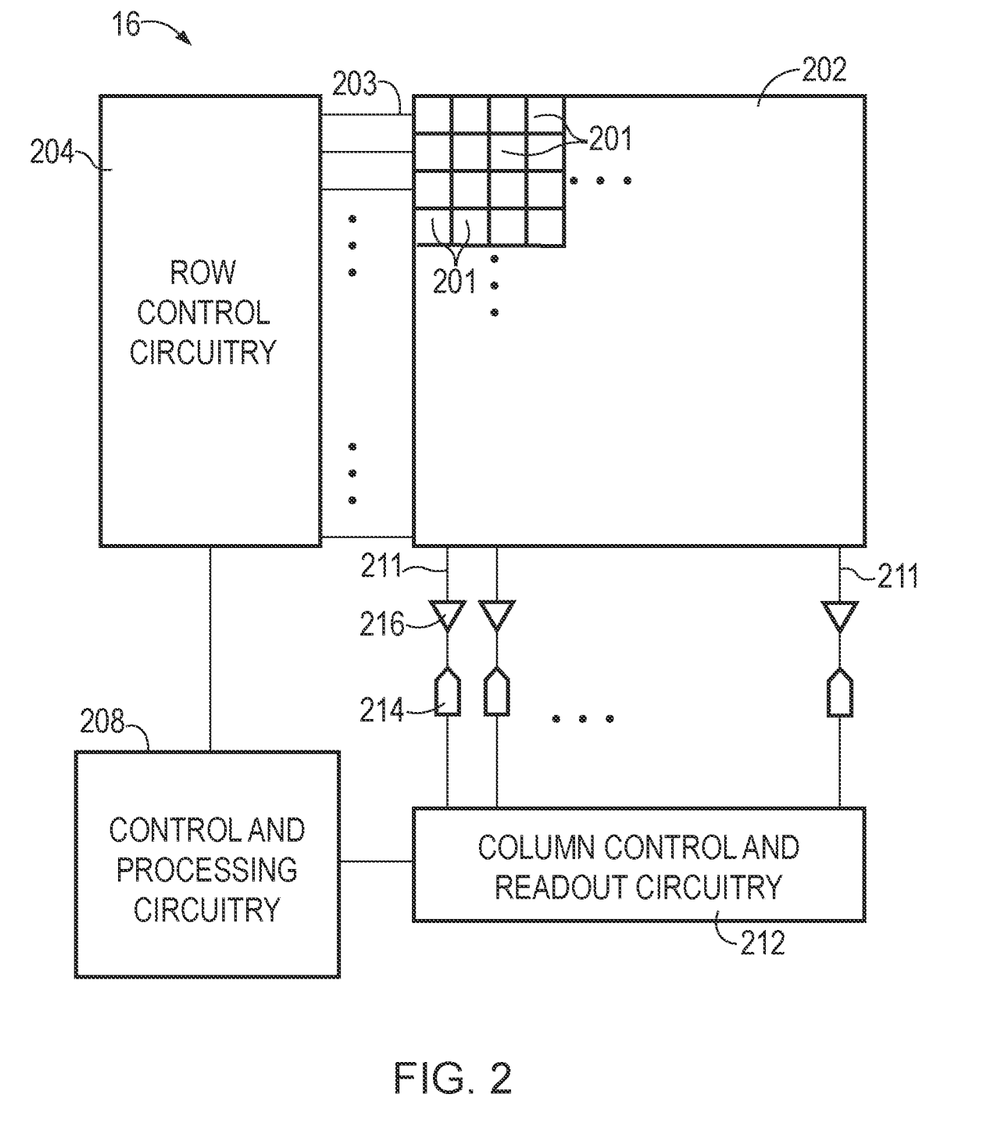
FIG. 2 is a diagram of an illustrative pixel array and associated row and column control circuitry for reading out image signals from an image sensor in accordance with some embodiments.

FIG. 2 is a diagram of an illustrative image pixel array in an image sensor. As shown in FIG. 2, the image sensor (e.g., image sensor 14 of FIG. 1) may include pixel array 202 having multiple pixels 201 (sometimes referred to herein as image pixels 201 or image sensor pixels 201) and row control circuitry 204 that is coupled to image pixel array 202. Row control circuitry 204 may provide pixel control signals (e.g., row select signals, pixel reset signals, charge transfer signals, etc.) to pixels 201 over corresponding row control lines 203 to control the capture and read out of images using image sensor pixels in array 202.

Image sensor 14 may include column control and readout circuitry 212 and control and processing circuitry 208 that is coupled to row control circuitry 204 and column circuitry 212. Column control circuitry 212 may be coupled to array 202 via multiple column lines 211. For example, each column of pixels 201 in array 202 may be coupled to a respective column line 211. A corresponding analog-to-digital converter (ADC) 214 and column amplifier 216 may be interposed on each column line 211 for amplifying analog signals captured by array 202 and converting the captured analog signals to corresponding digital pixel data. Column control and readout circuitry 212 may be coupled to external hardware such as processing circuitry. Column control and readout circuitry 212 may perform column readout based on signals received from control and processing circuitry 208. Column control and readout circuitry 212 may include column ADC circuits 214 and column amplifiers 216.

Amplifier 216 may be configured to receive analog signals (e.g., analog reset or image level signals) from pixel array 202 and to amplify the analog signals. The analog signals may include data from a single column of pixels or from multiple columns of pixels, depending on the application. ADC 214 may receive amplified analog signals from amplifier 216 and may perform analog-to-digital conversion operations on the analog signals to generate digital data. The digital data may be transmitted to column control and readout circuitry 212 for processing and readout.

Array 202 may have any number of rows and columns. In general, the size of array 202 and the number of rows and columns in array 202 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Figure 3:
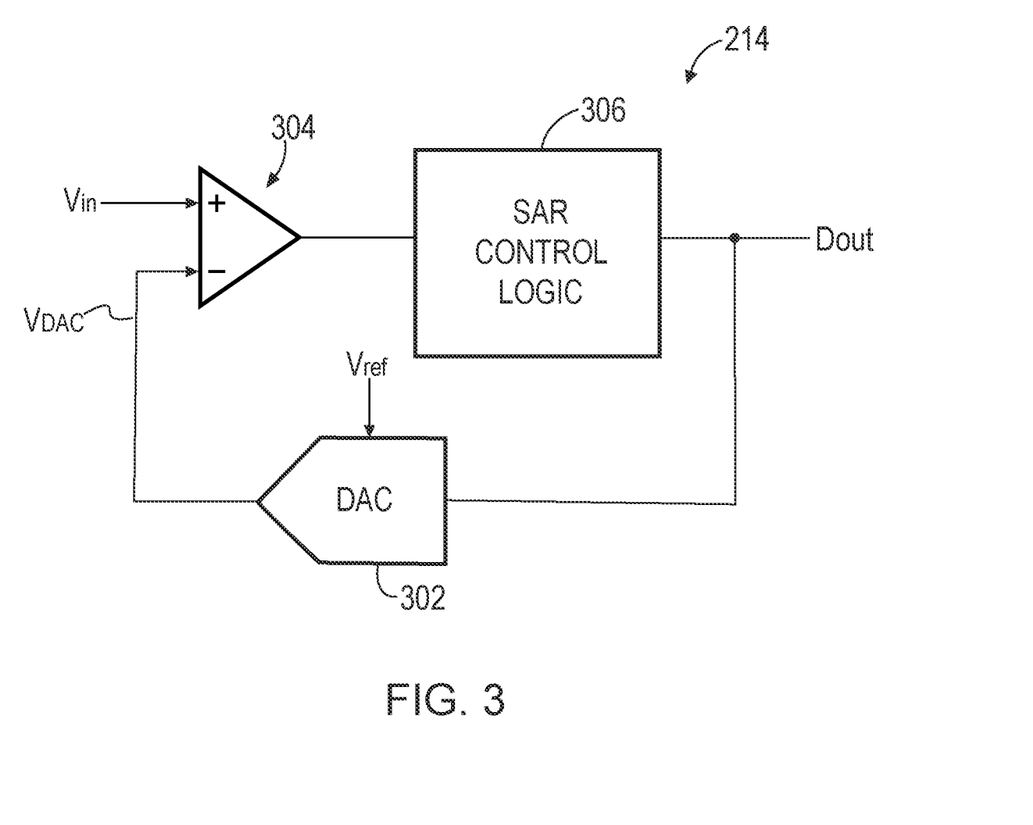
FIG. 3 is a diagram of an illustrative successive-approximation-register (SAR) analog-to-digital converter (ADC) in accordance with some embodiments.

FIG. 3 is a block diagram of an illustrative analog-to-digital converter (ADC) that may be included in an image sensor (e.g., ADC 214 of FIG. 2). As discussed in connection with FIG. 2, converter 214 may receive analog signals from pixel array 202. Analog-to-digital converter 214 may receive an input signal Vin. The input signal Vin may be an analog signal from one or more pixels 201 in pixel array 202 (for example, received over column line 211). Analog-to-digital converter 214 may be used to convert input analog signal Vin to corresponding equivalent digital pixel data.

In accordance with an embodiment, ADC 214 may be a successive-approximation-register (SAR) analog-to-digital converter. A successive-approximation-register ADC uses a binary search algorithm that is implemented using a digital-to-analog converter (DAC) 302, comparator 304, and successive-approximation-register (SAR) control logic 306. DAC 302 may output an analog signal $V_{DAC}$ that is compared to pixel signal Vin using comparator 304. The voltage output by DAC 302 ($V_{DAC}$) may be varied, thereby allowing successive comparisons to Vin. Each comparison may further narrow the range of possible values of Vin, with the number of comparisons determining the resolution of the conversion. DAC 302 may receive a reference voltage as an input (Vref). The output voltage from DAC 302 may be a known function of Vref. As an example, $V_{DAC}$ may be equivalent to half of the reference voltage, a quarter of the reference voltage, three quarters of the reference voltage, etc. DAC 302 may receive signals from SAR control logic 306 that determine the output of DAC 302.

Comparator 304 may receive voltage Vin at a first (positive) input and voltage $V_{DAC}$ at a second (negative) input. The comparator may compare the magnitude of voltage Vin to the magnitude of voltage $V_{DAC}$. The output of comparator 304 may be a signal that is provided to SAR control logic 306. The signal may have a value indicative of which signal has a higher voltage (e.g., the comparator output may be asserted at a logic high level "1" if Vin is greater than $V_{DAC}$, whereas the comparator output may be driven to a logic low level "0" if $V_{DAC}$ is greater than Vin).

SAR control logic 306 in FIG. 3 may sometimes be referred to as processing circuitry. Processing circuitry 306 may track the results of comparisons by comparator 304 and adjust the output of DAC 302 accordingly. Processing circuitry 306 may ultimately output the result Dout of the analog-to-digital conversion (i.e., a digital representation of Vin). DAC 302 may be any desired type of digital-to-analog converter. As an example, DAC 302 may be a charge sharing digital-to-analog converter. When DAC 302 is implemented as a charge sharing DAC, ADC 214 may be referred to as a charge sharing SAR ADC.

As described in the Background section, conventional charge sharing SAR ADCs sample an input signal onto an input capacitance and successively adds additional parallel capacitors to the input capacitance. The polarity in which the capacitors are added depends on the output of the comparator. The polarity is such that adding the capacitors brings the voltage on the input capacitor in parallel with the added capacitors closer to mid-range. Adding the capacitors also attenuates the signal. Attenuating the input signal in this way, however, makes the ADC more sensitive to the noise of the comparator.

Figure 4:
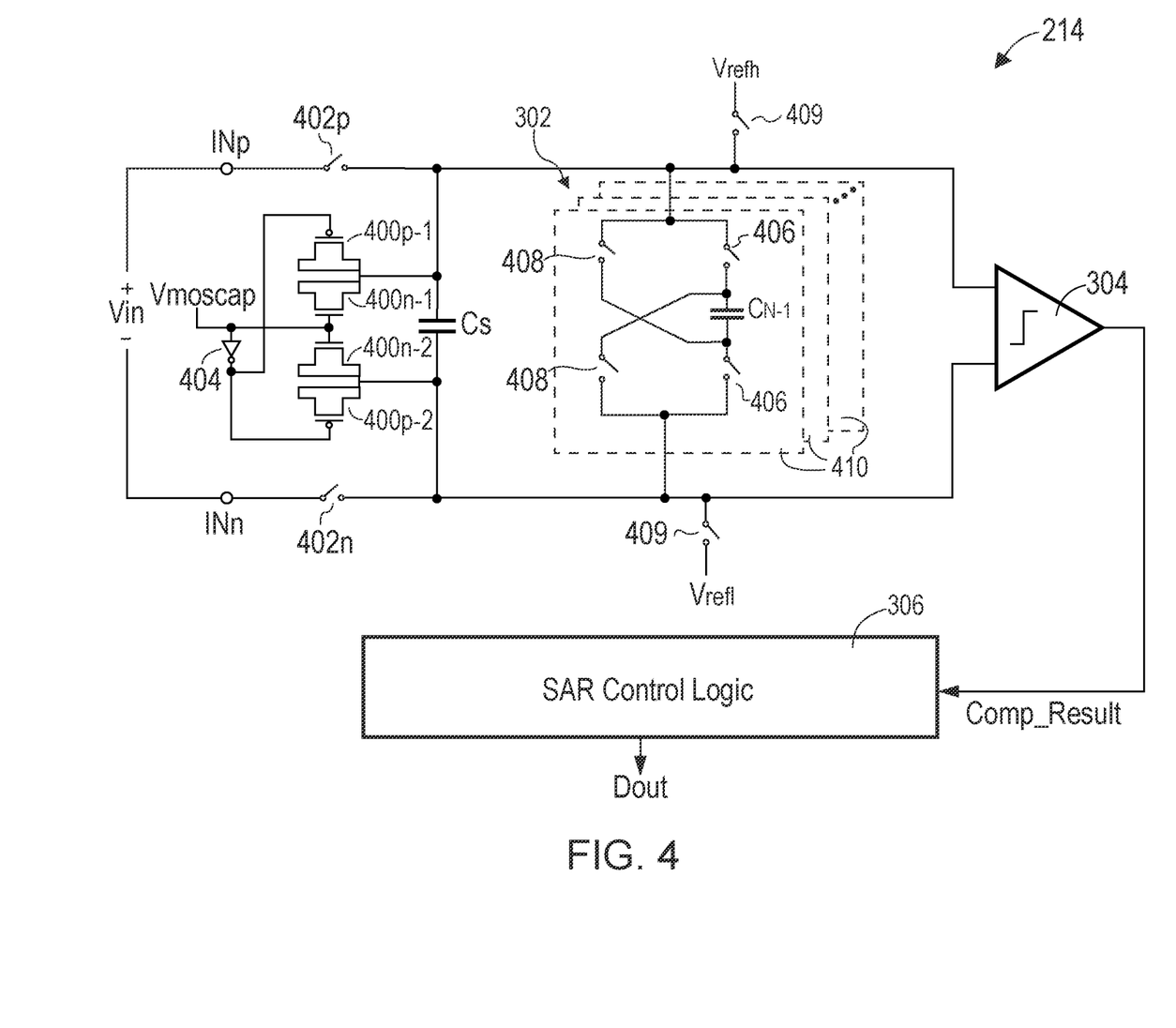
FIG. 4 is a circuit diagram showing of an illustrative charge sharing SAR ADC with switchable input metal-oxide-semiconductor capacitors in accordance with some embodiments.

In accordance with an embodiment, a charge sharing SAR ADC such as charge sharing successive-approximation-register analog-to-digital converter 214 is illustrated in FIG. 4 that reduces the attenuation of the input signal by effectively removing the input capacitance sometime during the conversion process while conserving the total signal charge. As shown in FIG. 4, converter 214 may have a first (positive) input port INp, a second (negative) input port INn, a first sampling switch 402p for selectively passing through signals from input port INp, a second sampling switch 402n for selectively passing through signals from input port INn, a sampling capacitor Cs for sampling the voltage across INp and INn, comparator 304 that receives sampled signals from capacitor Cs, SAR control logic 306 that receives results from the comparator output (see Comp_Result), and DAC 302 also coupled to the differential inputs of comparator 304. Input voltage Vin may be provided across differential input ports INp and INn. SAR control logic 306 may output control signals for turning on and off sampling switches 402p/402n, precharge switches 409, the switches within DAC 302, and may output final digital output signal Dout.

DAC 302 may include multiple capacitors that can be selectively coupled to the comparator input ports in parallel, as indicated by dotted boxes 410. For an N-bit charge sharing SAR ADC, DAC 302 may include N capacitors. As an example, a 10-bit charge sharing SAR ADC will include ten capacitors $C_9$, $C_8$, $C_7$, ..., $C_0$ within DAC 302. Thus, in general, an N-bit charge sharing SAR ADC may include N capacitors $C_{N-1}$, $C_{N-2}$, $C_{N-3}$, ..., $C_1$, $C_0$ within DAC 302. The N capacitor blocks 410 within DAC 302 may all be pre-charged to a known reference voltage level by turning on switches 409 using SAR control logic 306 (e.g., to supply a first reference voltage level Vrefh to the first comparator input and to supply a second reference voltage level Vrefl to the second comparator input). Each of the N capacitors within DAC 302 may be selectively coupled to in the input ports of comparator 304 in a first polarity (e.g., by using SAR control logic 306 to turn on switches 406, without turning on switches 408) or in a second polarity (e.g., by using SAR control logic 306 to turn on switches 408, without turning on switches 406).

In one embodiment, the DAC capacitors can be binary scaled (i.e., the DAC capacitors will have a radix-2 sizing scheme). In other words, an N-bit charge sharing SAR ADC will include N DAC capacitors with capacitance values C, 2C, 4C, 8C, 16C, ..., $2^{N-1}C$.

In other embodiments, the DAC capacitors can be implemented using a sub-radix-2 sizing/scaling scheme, where for any Nth capacitor, its capacitance $C_{N-1}$ is less than the sum of the capacitances of all smaller capacitors $C_{N-2}$, $C_{N-3}$, $C_{N-4}$, ..., $C_0$. As examples, instead of a scaling factor of 2, the scaling factor may be 1.9, 1.8, 1.7, 1.5-1.9999, any number between 1 and 2, or any suitable number that is less than 2. If desired, the scaling factor need not be constant and can be optimized at each DAC capacitor. In another suitable arrangement, some of the DAC capacitors can be scaled using a factor less than 2 while some of the other DAC capacitors can be scaled using a factor of 2 (e.g., the larger DAC capacitors can be sub-radix-2 while the smaller DAC capacitors can be radix-2).

A sub-radix-2 charge sharing SAR ADC provided as a present embodiment, exhibits an unexpected improvement of having an increased tolerance and reduced sensitivity to comparator offset. In other words, the sub-radix-2 scaling of the DAC capacitors can provide the additional margin that is needed when the comparator offset in the voltage domain represents a predictable but different signal (charge) domain in every cycle of the conversion. A radix of 1.9 might be able to provide a margin of about 10-50 mV of comparator offset or other suitable range (as an example). As long as the change in the equivalent charge caused by the comparator offset voltage is within the redundant range, the output of the conversion will be correct. While there is still an upper limit on the allowed comparator offset, sufficiently small comparator offsets will not impact the effective number of bits (ENOB) of ADC 214. Configured in this way, charge sharing SAR ADC 214 with sub-radix-2 capacitor scaling is able to overcome the comparator offset limitations and achieve resolutions of 10 bits or more.

As described above, input sampling capacitor Cs has a first terminal coupled to input port INp via switch 402p and has a second terminal coupled to input port INn via switch 402n. Sampling capacitor Cs has a fixed capacitance that is relatively small. If desired, sampling capacitance Cs may only consist of layout parasitic capacitance (i.e., Cs is not an explicit capacitor).

Still referring to FIG. 4, converter 214 may be further provided with switchable capacitive structures such as a metal-oxide-semiconductor capacitor 400n-1, a metal-oxide-semiconductor capacitor 400p-1, a metal-oxide-semiconductor capacitor 400n-2, and a metal-oxide-semiconductor capacitor 400p-2. Metal-oxide-semiconductor capacitors (MOSCAPs) 400n-1 and 400n-2 may be n-type (e.g., n-channel) transistors having gate terminals configured to receive control signal Vmoscap and having source-drain terminals coupled to opposing terminals of capacitor Cs. Metal-oxide-semiconductor capacitors (MOSCAPs) 400p-1 and 400p-2 may be p-type (e.g., p-channel) transistors having gate terminals configured to receive an inverted version of control signal Vmoscap (e.g., inverted using inverter 404) and having source-drain terminals coupled to opposing terminals of capacitor Cs. The bulk terminal of the n-type MOS capacitors may be coupled to a ground power supply line (as an example). The bulk terminal of the p-type MOS capacitors may be coupled to a positive power supply line (as an example). Control signal Vmoscap may be asserted (driven high) to activate the input MOSCAPs and may be deasserted (driven low) to deactivate the input MOSCAPs.

The example of FIG. 4 in which converter 214 includes both n-type MOSCAPs and p-type MOSCAPs is merely illustrative. As another example, analog-to-digital converter 214 might include only an n-type MOSCAPs 400n-1 and 400-2 without any p-type MOSCAPs. As another example, analog-to-digital converter 214 might include only p-type MOSCAPs 400p-1 and 400p-2 without any n-type MOSCAPs. In general, converter 214 may include one or more one n-type MOSCAP 400n coupled to the comparator input. If desired, converter 214 may one or more p-type MOSCAP 400p coupled to the comparator input.

Figure 5:
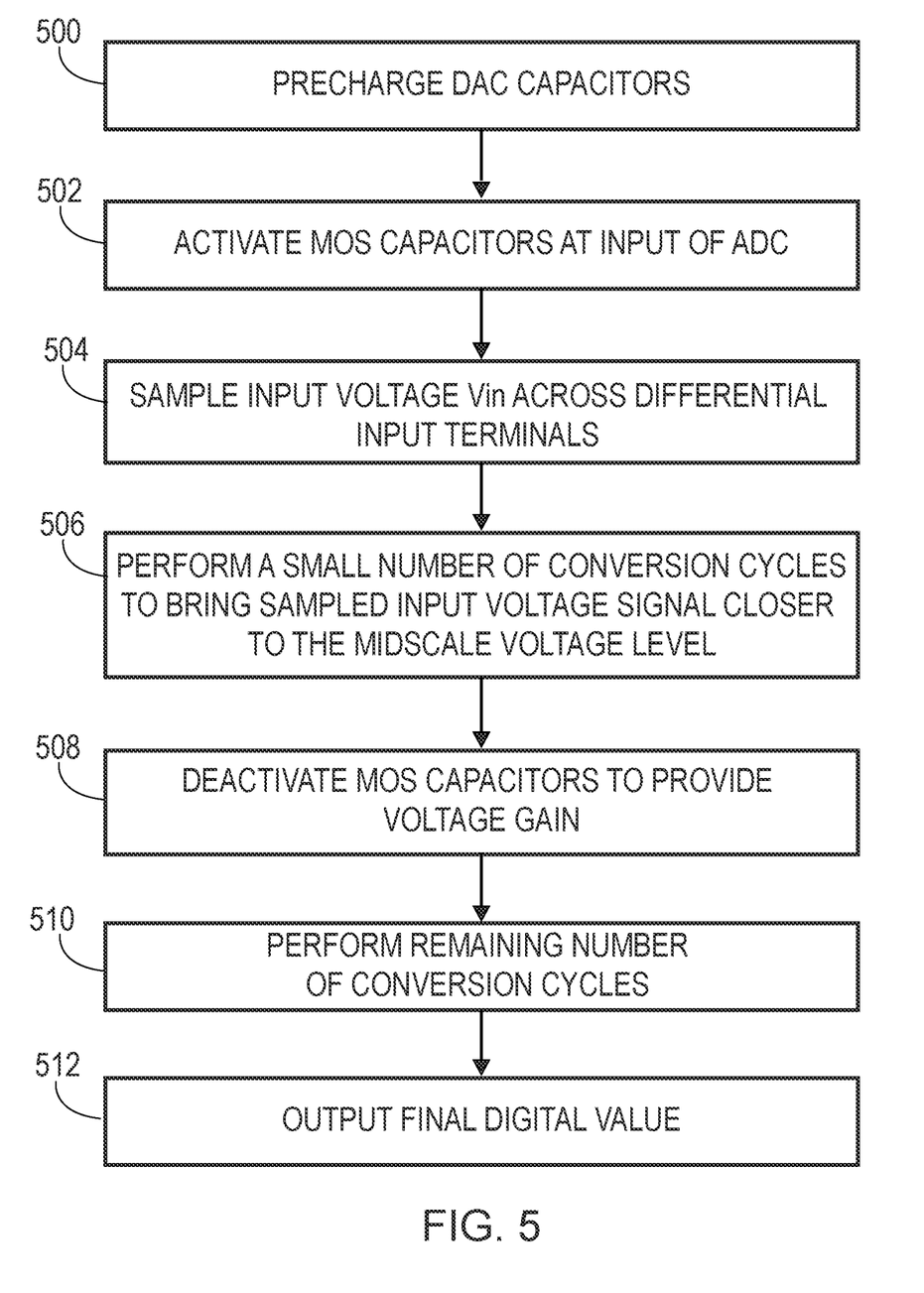
FIG. 5 is a flow chart of illustrative steps for operating the charge sharing SAR ADC of the type shown in FIG. 4 in accordance with some embodiments.

FIG. 5 is a flow chart of illustrative steps for operating charge sharing SAR ADC 214 of the type shown in FIG. 4. At step 500, the DAC capacitors can be precharged (e.g., by activating precharging switches and DAC connection switches 406 to precharge all of the capacitors within blocks 410 to the desired reference voltage level.

At step 502, all of the input MOS capacitors such as capacitors 400n-1, 400p-1, 400n-2, and 400p-2 may be activated at the input of the ADC. The MOS capacitors can be turned on by driving high signal Vmoscap. The n-type MOS capacitors 400n-1 and 400n-2 may be completely turned on by biasing their gate terminals to at least one threshold voltage above the positive supply voltage level. The p-type MOS capacitors 400p-1 and 400p-2 may be completely turned on by biasing their gate terminals to at least one threshold voltage below the ground power supply voltage level. This example in which the MOS capacitors are turned on after the precharge operation of block 500 is merely illustrative. As another example, the MOS capacitors can be turned on before the precharge step 500.

At step 504, the input voltage Vin may be sampled across the differential input ports of converter 214. This can be achieved by activating sampling switches 402p and 402n so that Vin is sampled across the two terminals of capacitor Cs. Step 504 may therefore sometimes be referred to as the charge sampling phase, the charge sampling period, or the charge sampling operation. Capacitor Cs can be an explicit capacitor, only parasitic capacitance, or a combination of one or more explicit capacitor with associated parasitic capacitance. In other words, input voltage Vin is sampled onto the input capacitance while the MOS capacitors are activated. When activated, the MOS capacitors provide additional device capacitance (e.g., gate capacitance, drain capacitance, source capacitance, etc.) associated with devices 400n-1, 400n-2, 400p-1, and 400p-2, which add to the total input capacitance of converter 214. The noise of converter 214 is set by the sampling noise of this total input capacitance.

At step 506, converter 214 may perform a small number of conversions to bring the sampled input voltage signal closer to the midscale voltage level (i.e., a few cycles of the SAR operation may bring the input signal closer to half the reference voltage level). Each conversion may involve switching in the next largest capacitor within blocks 410 and evaluating comparator 304. Charge is added in the correct polarity using switches 406 or 408 to converge the input signal toward midrange. As an example, only one conversion cycle may be performed at step 506. As another example, two conversion cycles may be performed at step 506. As yet another example, three conversion cycles may be performed at step 506. In general, one to five, zero to six, three to seven, or any suitable number of conversions may take place during step 506 prior to deactivating the MOS capacitors.

At step 508, the MOS capacitors may be deactivated to provide a voltage gain. To accomplish this, voltage Vmoscap is deasserted (driven low). The charge that was previously on the MOSCAPs is pushed to fixed capacitor Cs and any of the DAC capacitors that have been added by the few cycles of SAR operation. In other words, the capacitance associated with the MOSCAPs is removed or disappears as they are deactivated at step 508.

Since the same amount of charge is now forced onto a smaller total capacitance, there will be a voltage gain due to the principal of conversation of charge. Since the total charge is not changing, no additional noise is generated. The charge discharging or moving out of the MOSCAPs occurs almost instantaneously, so the final signal level is immediately reached (i.e., the settling time is minimal and is not bandwidth limited). The gain will be set by the ratio of the sum of the MOSCAP capacitance and fixed Cs to the fixed Cs. Achieving gain in this way improves the ADC 214 by reducing its sensitivity to the noise of the comparator, thereby enhancing the overall noise performance of the ADC. Amplifying the signal after a couple of conversion steps when the signal is smaller helps avoid the risk of saturation when gaining up large input signals.

At step 510, converter 214 may perform the remaining number of conversions (e.g., to perform the fine conversion steps to obtain the remainder of the least significant bits). At step 512, a final digital output value will be generated at the output of control logic 306. Performing SAR ADC conversion in this way provides voltage amplification without increasing the noise beyond the inherent sampling noise and with relatively low dynamic power consumption related only to the switching of the control signals on the MOS capacitors. Power consumption in converter 214 is minimized since the MOSCAPs do not draw any static power.

Converter 214 (sometimes referred to as a MOS capacitor based charge sharing SAR ADC) is a low power, low noise, and high speed analog-to-digital converter that is not limited to only image sensor applications. The example of FIG. 4 in which converter 214 has a differential input port is also merely illustrative. In other suitable embodiments, converter 214 may have a single-ended input port.

Various embodiments of a charge sharing SAR ADC having switchable input MOSCAPs are provided. In accordance with some embodiments, an image sensor is provided that includes an image sensor pixel, a column line configured to receive a signal from the image sensor pixel, and a data converter coupled to the column line. The data converter can include first input port, a second input port, a comparator having a first input coupled to the first input port and having a second input coupled to the second input port, a digital-to-analog converter coupled to at least one of the first and second inputs of the comparator, and a metal-oxide-semiconductor capacitor having source-drain terminals coupled to the first input port and a gate terminal configured to receive a control signal.

The data converter can further include a sampling capacitor having a first terminal coupled to the first input port and having a second terminal coupled to the second input port, a first sampling switch coupled between the first input port and the first terminal of the sampling capacitor, a second sampling switch coupled between the second input port and the second terminal of the sampling capacitor, a first additional metal-oxide-semiconductor capacitor having source-drain terminals coupled to the first terminal of the capacitor and a gate terminal configured to receive an inverted version of the control signal, a second additional metal-oxide-semiconductor capacitor having source-drain terminals coupled to the second terminal of the capacitor and a gate terminal configured to receive the control signal, and a third additional metal-oxide-semiconductor capacitor having source-drain terminals coupled to the second terminal of the capacitor and a gate terminal configured to receive the inverted version of the control signal. The metal-oxide-semiconductor capacitor and the second additional metal-oxide-semiconductor capacitor can be n-type metal-oxide-semiconductor capacitors, whereas the first additional metal-oxide-semiconductor capacitor and the third additional metal-oxide-semiconductor capacitor can be p-type metal-oxide-semiconductor capacitors.

In accordance with some embodiments, a method of operating an image sensor is provided that includes reading a signal from an image sensor pixel, conveying the signal through a column line, using a data converter to receive the signal from the column line, using the data converter to activate a metal-oxide-semiconductor capacitor, and using the data converter to sample the received signal while the metal-oxide-semiconductor capacitor is activated. The method can further include using the data converter to perform a first number of conversions, using the data converter to provide a voltage gain by deactivating the metal-oxide-semiconductor capacitor after performing the first number of conversions, and performing a second number of conversions with the data converter after deactivating the metal-oxide-semiconductor capacitor. The method can further include using the data converter to precharge digital-to-analog converter capacitors prior to or after activating the metal-oxide-semiconductor capacitor.

In accordance with some embodiments, a data converter is provided that includes an input port, a comparator having an input coupled to the input port, a digital-to-analog converter coupled to the input of the comparator, and a metal-oxide-semiconductor capacitor having source-drain terminals coupled to the input port and having a gate terminal configured to receive a control signal that is asserted during a charge sampling phase and that is subsequently deasserted to provide a voltage gain. The data converter can further include a sampling capacitor coupled to the input port and an additional metal-oxide-semiconductor capacitor having source-drain terminals coupled to the source-drain terminals of the metal-oxide-semiconductor capacitor and having a gate terminal configured to receive an inverted version of the control signal. The data converter can further include an additional input port, where the comparator has an additional input coupled to the additional input port, and an additional metal-oxide-semiconductor capacitor having source-drain terminals coupled to the additional input port and having a gate terminal configured to receive the control signal.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   an image sensor pixel;
   a column line configured to receive a signal from the image sensor pixel; and
   a data converter coupled to the column line, wherein the data converter comprises:
     a first input port;
     a second input port;
     a comparator having a first input coupled to the first input port and having a second input coupled to the second input port;
     a digital-to-analog converter coupled to at least one of the first and second inputs of the comparator;
     a sampling capacitor having a first terminal coupled to the first input port and having a second terminal coupled to the second input port; and
     a metal-oxide-semiconductor capacitor having source-drain terminals coupled to the first input port and a gate terminal configured to receive a control signal.

2. The image sensor of claim 1, wherein the data converter further comprises:
   a first sampling switch coupled between the first input port and the first terminal of the sampling capacitor;
   a second sampling switch coupled between the second input port and the second terminal of the sampling capacitor;
   a first additional metal-oxide-semiconductor capacitor having source-drain terminals coupled to the first terminal of the capacitor and a gate terminal configured to receive an inverted version of the control signal;
   a second additional metal-oxide-semiconductor capacitor having source-drain terminals coupled to the second terminal of the capacitor and a gate terminal configured to receive the control signal; and
   a third additional metal-oxide-semiconductor capacitor having source-drain terminals coupled to the second terminal of the capacitor and a gate terminal configured to receive the inverted version of the control signal.

3. The image sensor of claim 2, wherein:
   the metal-oxide-semiconductor capacitor and the second additional metal-oxide-semiconductor capacitor comprise n-type metal-oxide-semiconductor capacitors; and
   the second metal-oxide-semiconductor capacitor and the fourth additional metal-oxide-semiconductor capacitor comprise p-type metal-oxide-semiconductor capacitors.

4. The image sensor of claim 1, wherein the digital-to-analog converter comprises capacitors sized using a sub-radix-2 scaling scheme.

5. The image sensor of claim 1, further comprising:
   a first additional metal-oxide-semiconductor capacitor having source-drain terminals coupled to the second input port and a gate terminal configured to receive the control signal.

6. The image sensor of claim 5, further comprising:
   a second additional metal-oxide-semiconductor capacitor having source-drain terminals coupled to the first input port and a gate terminal configured to receive an inverted version of the control signal.

7. The image sensor of claim 6, further comprising:
   a third additional metal-oxide-semiconductor capacitor having source-drain terminals coupled to the second input port and a gate terminal configured to receive the inverted version of the control signal.

8. The image sensor of claim 1, further comprising:
   an additional metal-oxide-semiconductor capacitor having source-drain terminals coupled to the first input port and a gate terminal configured to receive an inverted version of the control signal.

9. The image sensor of claim 1, wherein the metal-oxide-semiconductor capacitor is activated during a charge sampling phase.

10. The image sensor of claim 1, wherein the metal-oxide-semiconductor capacitor is activated during a first number of conversion cycles.

11. The image sensor of claim 10, wherein the metal-oxide-semiconductor capacitor is deactivated prior to a second number of conversion cycles following the first number of conversion cycles to provide a voltage gain.

12. A method of operating an image sensor, comprising:
    reading a signal from an image sensor pixel;
    conveying the signal through a column line;
    with a data converter, receiving the signal from the column line;
    with the data converter, activating a metal-oxide-semiconductor capacitor; and
    with the data converter, sampling the received signal while the metal-oxide-semiconductor capacitor is activated.

13. The method of claim 12, further comprising:
    with the data converter, performing a first number of conversions;
    after performing the first number of conversions, using the data converter to provide a voltage gain by deactivating the metal-oxide-semiconductor capacitor; and
    after deactivating the metal-oxide-semiconductor capacitor, performing a second number of conversions with the data converter.

14. The method of claim 13, wherein the first number is equal to zero, one, two, three, four, five or six.

15. The method of claim 12, further comprising:
    with the data converter, providing a voltage gain by deactivating the metal-oxide-semiconductor capacitor.

16. The method of claim 12, further comprising:
    with the data converter, precharging digital-to-analog converter capacitors prior to activating the metal-oxide-semiconductor capacitor.

17. The method of claim 12, further comprising:
    with the data converter, precharging digital-to-analog converter capacitors after activating the metal-oxide-semiconductor capacitor.

18. A data converter, comprising:
    an input port;
    a comparator having an input coupled to the input port;
    a digital-to-analog converter coupled to the input of the comparator; and a metal-oxide-semiconductor capacitor having source-drain terminals coupled to the input port and having a gate terminal configured to receive a control signal that is asserted during a charge sampling phase and that is subsequently deasserted to provide a voltage gain.

19. The data converter of claim 18, further comprising:

a sampling capacitor coupled to the input port; and an additional metal-oxide-semiconductor capacitor having source-drain terminals coupled to the source-drain terminals of the metal-oxide-semiconductor capacitor and having a gate terminal configured to receive an inverted version of the control signal.

20. The data converter of claim 18, further comprising:

an additional input port, wherein the comparator has an additional input coupled to the additional input port; and an additional metal-oxide-semiconductor capacitor having source-drain terminals coupled to the additional input port and having a gate terminal configured to receive the control signal.

* * * * *